United States Patent [19]
Klein

[11] Patent Number: 5,883,790
[45] Date of Patent: Mar. 16, 1999

[54] SOCKET FOR RETAINING MULTIPLE ELECTRONIC PACKAGES

[75] Inventor: Dean A. Klein, Lake City, Minn.

[73] Assignee: Micron Electronics, Inc., Nampa, Id.

[21] Appl. No.: 921,948

[22] Filed: Aug. 26, 1997

Related U.S. Application Data

[63] Continuation of Ser. No. 539,486, Oct. 5, 1995, Pat. No. 5,721,673.
[51] Int. Cl.⁶ .............................. H05K 7/10; H05K 7/12; H01R 13/62
[52] U.S. Cl. ......................... 361/809; 361/807; 361/808; 439/342; 439/368
[58] Field of Search .................................... 361/807–810; 439/259, 261, 264, 328, 342, 368

[56] References Cited

U.S. PATENT DOCUMENTS

| | | | |
|---|---|---|---|
| 5,367,436 | 11/1994 | Ikei | 361/766 |
| 5,454,727 | 10/1995 | Hsu | 439/342 |
| 5,466,169 | 11/1995 | Lai | 439/259 |
| 5,588,861 | 12/1996 | Townsend | 439/342 |

OTHER PUBLICATIONS

Drawing of voltage regulator module with VRM socket; AMP Incorporated, Mar. 15, 1995.
Spec Sheet for "DS1213B SmartSocket 16/64K"; Dallas Semiconductor; p. 347, undated.
Spec Sheet for "DS1232/S MicroMonitor Chip"; Dallas Semiconductor; p. 722, undated.
Photocopies of Foxconn® VRM Header 7 (Part No. HL91157) and Augat® Socket 5 (Part No. M45010); two sheets, undated.

*Primary Examiner*—Leo P. Picard
*Assistant Examiner*—John B. Vigushin
*Attorney, Agent, or Firm*—Dorsey & Whitney LLP

[57] ABSTRACT

The present invention relates to an improved socket for use with a printed circuit board. The socket removably secures an integrated circuit package and a separate electronic item to a printed circuit board. The socket includes a non-moveable member and a moveable member. The non-moveable member has a first plurality of pin-contacting sections for receiving pins that extend from the integrated circuit package. At least one of these pin-contacting sections is electrically connected to the printed circuit board. The moveable member has a second plurality of pin-contacting sections for securing the pins that extend from the integrated circuit package when the moveable member is in a locked position. The moveable member also includes a retaining projection to at least partially secure the separate electronic item when the moveable member is in the locked position. The socket may also include a lever that is rotatably connected within the non-moveable member. Rotation of this lever to a first position causes the moveable member to move into the locked position, which secures both the integrated circuit package and the separate electronic item to the printed circuit board.

28 Claims, 3 Drawing Sheets

SOCKET FOR RETAINING MULTIPLE ELECTRONIC PACKAGES

This is a continuation of application Ser. No. 08/539,486, filed on Oct. 5, 1995, now U.S. Pat. No. 5,721,673.

FIELD OF THE INVENTION

The present invention relates generally to sockets for removably retaining electronic circuit cards and integrated circuit packages.

BACKGROUND OF THE INVENTION

Processing of electronic components has advanced to the stage that the outdating of newly-designed electronic devices and systems is expected in a relatively short time period. Customers of such devices and systems are reluctant to purchase such electronic equipment one year, only to find that the equipment will have to be completely replaced shortly thereafter. Computer-based products, for example, desk-top computer stations, have experienced this dilemma over the last few decades.

The computer industry has responded by providing equipment which is specifically designed to be upgraded with more advanced and more powerful technology. By designing equipment that requires replacement of only a few important components, for example, the CPU (central processing unit) and memory chips, the overall computer-based products does not have to be replaced. Thus, in response to an advancement in the processing speed of a newly-designed CPU, or to advancements in the speed and capacity of a newly-designed memory chip, only these specific newly-designed components need to be replaced.

For a variety of reasons, the processing techniques of electronic components have resulted in these newly-designed components requiring different operating-power levels. Using the same example from above, newly-designed memory chips and CPUs require significantly reduced voltage supply levels. In upgrading a computer-based system currently operating from a 5 Volt power supply, for example, a newly-designed, more advanced CPU might require a 3.3 Volt power supply. Consequently, the industry approach of upgrading only the more advanced components has had to be modified by the step of also replacing or adding a power supply.

One of the more recent attempts to provide this type of upgrade for a CPU requires the computer-based equipment being specially designed to include two part-retaining sockets soldered to a printed circuit board (PCB). When the equipment is originally sold, one of these part-retaining sockets removably retains the CPU in a zero-insertion-force (ZIF) socket, and the other removably retains a module comprised of a voltage regulator circuit mounted on a mini-PCB. The PCB which retains each of the sockets includes embedded electrical connections for connecting power pins of the voltage regulator module and the CPU, and includes numerous PCB-mounted decoupling capacitors for the power signals carried in the electrical connections.

Upgrading the CPU with the more advanced technology involves removing the then-installed CPU and voltage regulator module, inserting the upgraded CPU and upgraded voltage regulator module into the respective sockets, and then manipulating various mechanical latches to secure each of these upgraded parts in place.

In connection with the present invention, it has been discovered that this upgrade/design approach is relatively cumbersome from an installation perspective and disadvantageous from a cost and reliability perspective. In terms of installation, the approach requires manipulation of a zero-insertion-force (ZIF) lever attached to the first socket for retaining the CPU therein. The approach further requires manual rotation of two independent levers, which are on the second socket, for retaining the voltage regulator module.

In terms of cost and reliability, it has been discovered that this type of upgrade/design implementation requires an unjustified amount of PCB space and an excessive number of decoupling capacitors. It has further been discovered in connection with the present invention that this upgrade implementation requires an excessive number of moving parts, thereby resulting in unneeded cost, labor and exposure to the potential of component damage due to static shocks.

Accordingly, there is a need for a socket arrangement which can be used in PCB designs and for component upgrades without experiencing the above-mentioned shortcomings.

SUMMARY OF THE INVENTION

Generally, the present invention provides an improved socket/PCB arrangement for upgrading integrated circuit packages requiring special peripheral support circuitry.

In one particular embodiment, the present invention is implemented in the form of a socket for use with a printed circuit board. The socket removably secures an integrated circuit package and a separate electronic item to a printed circuit board. The socket includes a non-moveable member and a moveable member. The non-moveable member has a first plurality of pin-contacting sections for receiving pins that extend from the integrated circuit package. At least one of these pin-contacting sections is electrically connected to the printed circuit board. The moveable member has a second plurality of pin-contacting sections for securing the pins that extend from the integrated circuit package when the moveable member is in a locked position. The moveable member also includes a retaining projection to at least partially secure the separate electronic item when the moveable member is in the locked position. The socket may also include a lever that is rotatably connected within the non-moving member. Rotation of this lever to a first position causes the moveable member to move into the locked position, which secures the separate electronic item, as well as the integrated circuit package, to the printed circuit board.

In another particular embodiment, the present invention is implemented in the form of a printed circuit board assembly. The printed circuit board assembly has a main printed circuit board, an integrated circuit package, a separate electronic item, and a socket for removeably securing the integrated circuit package and the separate electronic item to the printed circuit board. The socket includes a non-moveable and a moveable member. The non-moveable member has a first plurality of pin-contacting sections for receiving pins that extend from the integrated circuit package, with at least one of these pin-contacting sections being electrically connected to the printed circuit board. The moveable member has a second plurality of pincontacting sections for securing the pins that extend from the integrated circuit package when the moveable member is in a locked position. The moveable member also includes a retaining projection to at least partially secure the separate electronic item when the moveable member is in the locked position. The separate electronic item may be supported either on the socket or the main printed circuit board.

The above summary of the present invention is not intended to present each embodiment or every aspect of the present invention. This is the purpose of the figures and the associated description and claims, which follow.

BRIEF DESCRIPTION OF THE DRAWINGS

Other aspects and advantages of the present invention will become apparent upon reading the following detailed description and upon reference to the drawings in which.

Figure 1:
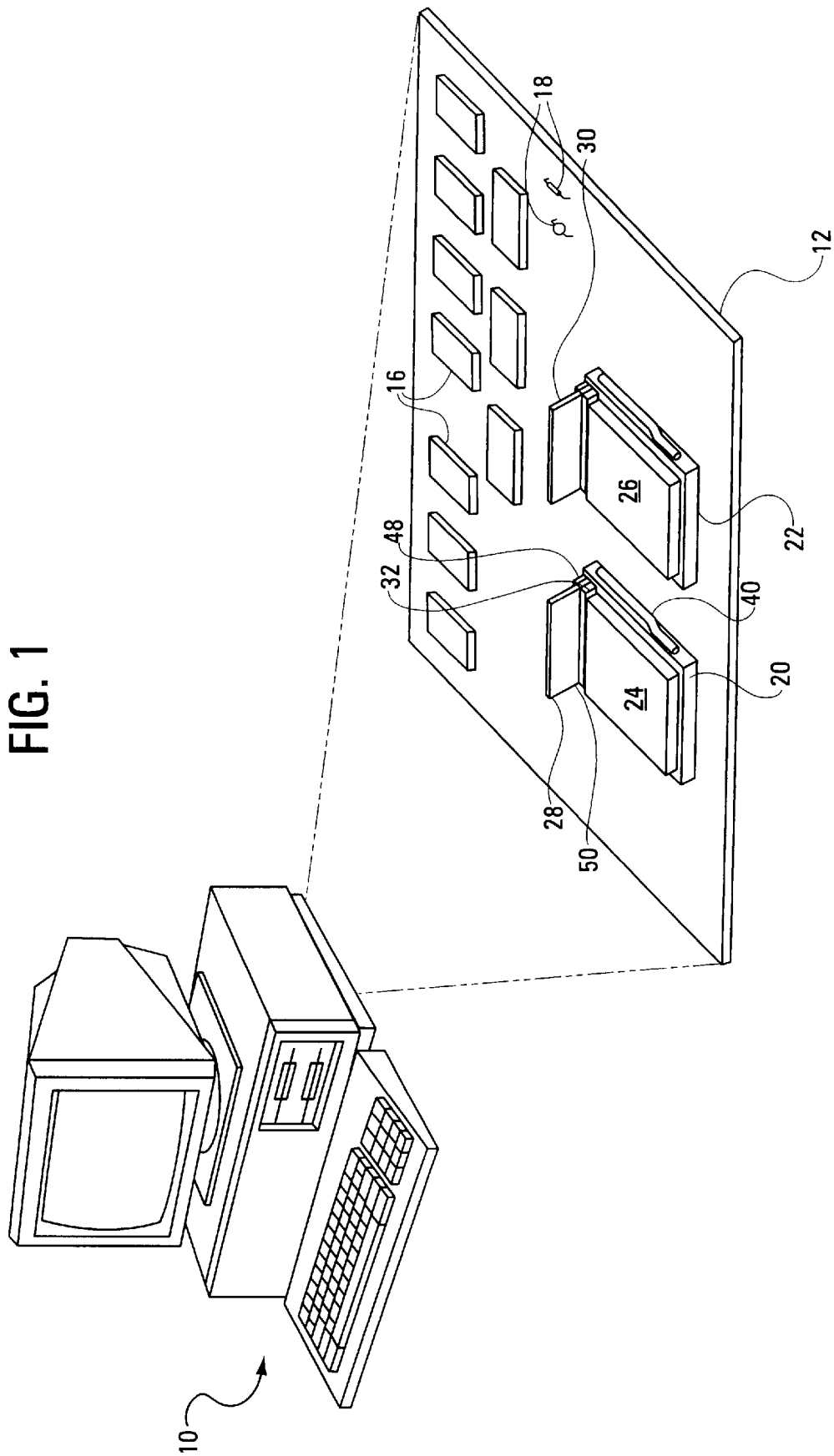
FIG. 1 is a perspective illustration of a desktop computer including a CPU printed circuit board constructed and designed in accordance with the principles of the present invention.

While the invention is susceptible to various modifications and alterative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention has a variety of applications in electronic computer-related products and systems requiring or benefiting from replacement of components. The present invention has been found to be especially applicable and advantageous in equipment using memory chips and microcomputers ("CPUs") requiring upgraded technology. This type of circuit design is used in desktop computers, as illustrated in FIG. 1 by reference numeral 10.

FIG. 1 illustrates both a perspective view of such a desktop computer 10 and an exploded view of the computer's internal main printed circuit board (PCB) 12. The main PCB 12 includes a variety of integrated circuit packages 16 as well as discrete components 18, some of which are shown for illustrative purposes. The main PCB further includes layers of electrical conductors (not shown) which are used to interconnect the integrated circuit packages and to connect the integrated circuit packages to the power signals (for example, +5 Volts and common).

Also shown in FIG. 1 on the main PCB 12 is a pair of sockets 20 and 22, each of which is implemented to embody the principles of the present invention. Each of these sockets 20 and 22 is shown securing an integrated circuit package 24 (or 26) and another separate electronic item 28 (or 30). The particular items shown to be secured in the socket 20 are a CPU 24 and a voltage regulator module 26.

The CPU 24 may be implemented using, for example, the PENTIUM CPU. ("PENTIUM" is a registered trademark owned by Intel Corporation). For such a CPU, the socket 20 includes hundreds of electrical conductors 25 (FIG. 2A) on the bottom side for soldering to the printed circuit board and the same number of pin-contacting apertures for receiving the same number of pins 27 (FIG. 2A) extending from the CPU 24.

The voltage regulator module 28 includes an electronic circuit supporting a voltage regulator IC (not shown) and connecting to a female socket 32. The female socket 32 has two rows of 15 pin-receptacles each. This set of pin receptacles is used to electrically connect, and partially secure, the voltage regulator module 28, via a corresponding set of connector pins 29 (FIGS. 2A and 2B) to the socket 20. The voltage regulator module 28 may be implemented as depicted in drawing number C-94-4163-078, available from AMP Incorporated.

The items shown to be secured in the socket 22 (which is constructed using the same principles as for the socket 20) include the same or a similar voltage regulator module 30, and integrated circuit package 26 can be implemented using a second CPU or a memory chip. The choice is specific to the application and, therefore, the particular design of the PCB 12.

An important aspect of the present invention is its minimization of space, parts and the number of levers that require manual engagement for holding the items within each socket. As shown in each of FIGS. 1, 2A and 2B, a single lever including a first axis 40 is used for holding both the CPU 24 and the voltage regulator module 28 within the socket 20. The lever is constructed and arranged to move within a non-moving member 36 of the socket 20, so that a moving member 38 (also part of the socket 20) moves laterally (from right to left from the perspective of FIGS. 2A and 2B).

Figure 2A:
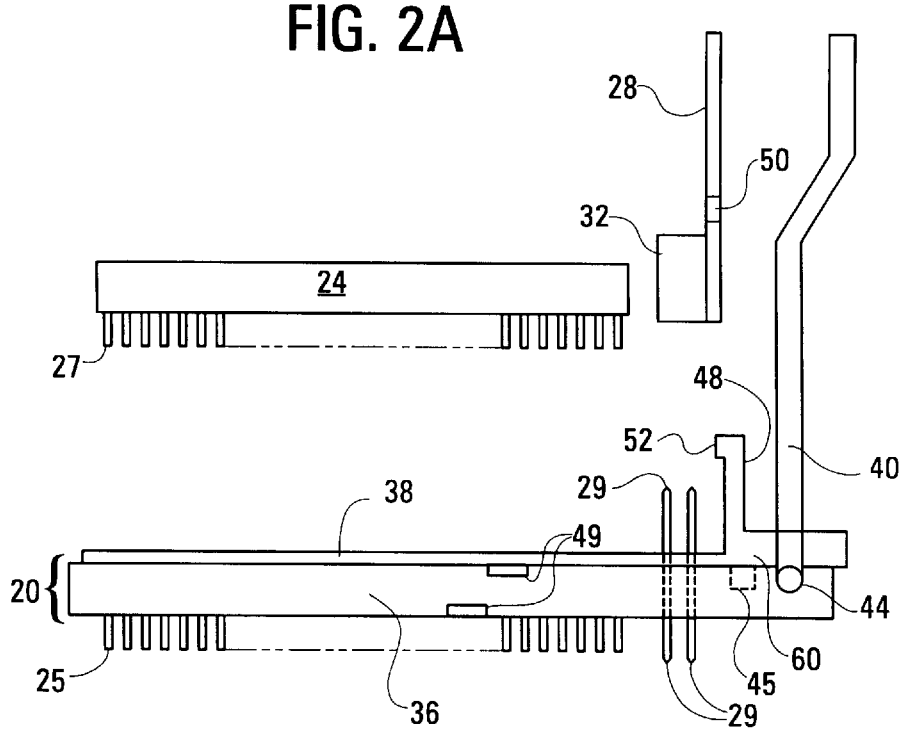
FIG. 2A is a pre-assembly drawing illustrating an exemplary implementation of a socket arrangement, shown from a side view, designed in accordance with the principles of the present invention.
Figure 2B:
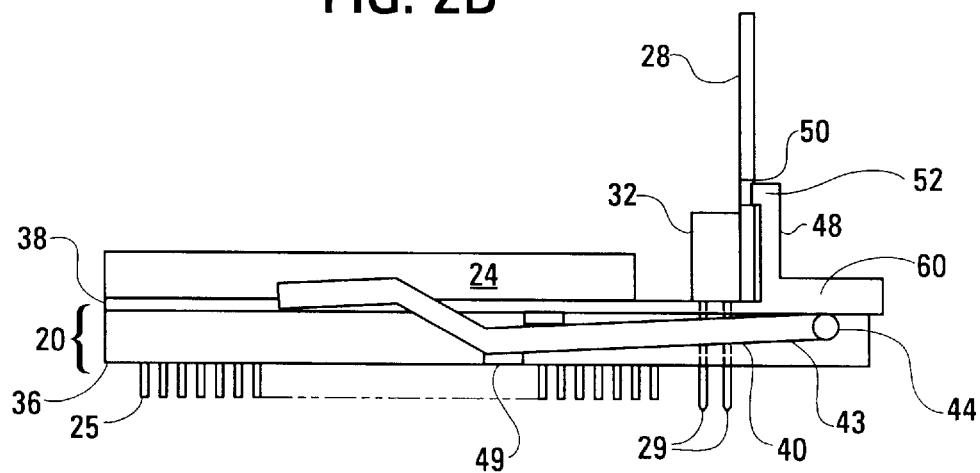
FIG. 2B is a drawing of the socket arrangement shown in FIG. 2A, also. shown from a side view, but showing the postassembly implementation in accordance with the principles of the present invention.

By manually rotating the first axis 40 counter-clockwise from an upright position, as shown in FIG. 2A, to a horizontal position, as shown in FIG. 2B, the status of the socket 20 is thereby converted from a removal/insertion (or unlocked) position to an item-secured (or locked) position. To effect this change in position, the lever includes a second axis 44 extending from the end of the first axis 40 into the socket (into the page as viewed from the perspective of FIGS. 2A and 2B). The offset portion 43 (FIG. 2B) of this second axis 44 is offset upwardly as viewed from the perspective of FIG. 2A (and to the left as viewed from the perspective of FIG. 2B). When the first axis 40 is rotated in the counterclockwise direction, the offset portion 43 of the second axis 44 engages an downwardly extending cam portion 45 (FIG. 2A), which extends down from the moving member. Because the cam portion is an integral part of the moving member 38, when the cam portion moves laterally, the entire moving member 38 moves laterally to provide locking tension on, and electrical connection with, the pins 27 extending from the CPU 24. The first axis 40 is then held in place using locking nubs 49 which extend outwardly from the side of the nonmoving member 36.

This type of cam action and lateral motion is conventional. For further details, reference may be made to the CPU socket implemented as part No. 916637-1 available from AMP Incorporated.

In accordance with the principles of the present invention, this rotation of the first axis 40 also causes the moving member 38 to secure the voltage regulator module 28 on the pins 29. As shown in FIG. 2A, the moving member 38 includes a pair of retaining arms 48 for interfacing an aperture (or cutout) 50 in each edge of the PCB portion of the voltage regulator module 28. Each retaining arm includes a shoulder 52 which is designed to fit into the aperture 50 for the purpose of holding the voltage regulator module 28 in its fully connected position, as shown in FIG. 2B. A reinforcing portion 60 of the moving member 38 is used to provide stability to the retaining arms 48.

Accordingly, with both the CPU 24 and the voltage regulator module 28 in place on the socket, moving the first (lever) axis 40 from the position shown in FIG. 2A in the counter-clockwise direction results in the firm retainment of both the CPU 24 and the voltage regulator module 28, with no other manual action or manual intervention required.

Figure 3:
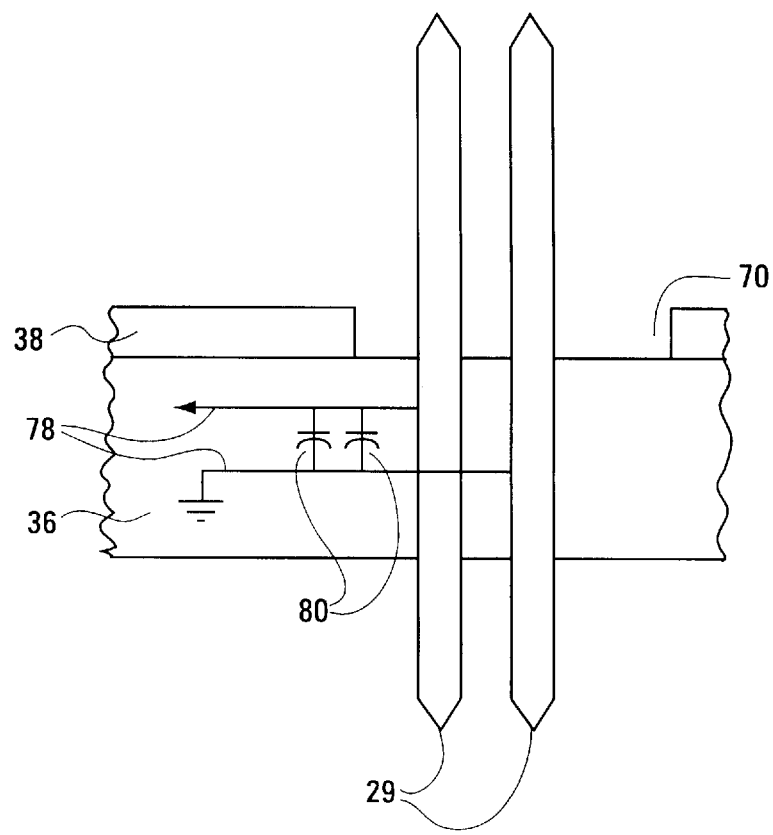
FIG. 3 is a partial side view of the socket arrangement shown in FIG. 2A, and illustrating aspects, in accordance with the principles of the present invention, which are not illustrated in the previous figures.

Referring now to FIG. 3, a cross-section of the socket 20 is illustrated with the location of the pins 29 being included as part of the non-moveable member 36 and through a receiving aperture 70 of the moving member 38. As the moving member 38 is moved laterally (from right to left), the aperture 70, which is surrounded by four edges/walls of the moving member, provides a gap so that the moving member can be guided laterally across the non-moving member without interference from the stationary structure associated with the retainment of the pins 29.

As an alternative arrangement, the pins 29 can be located and secured adjacent the opposite end as part, or secured to the main PCB independent, of the nonmoving member. In this alternative arrangement, the retaining arms 48 are located and secured at the top of the moving member. When the moving member is moved into the locked position, the shoulders 52 of the retaining arms 48 fit into the apertures 50 of the voltage regulator module 28.

With the pins 29 located and secured adjacent the end, but separate and independent, of the nonmoving member, the main PCB and the socket are designed such that the socket and the structure supporting the pins 29 are arranged closely next to one another. This optimizes the fit between the shoulders 52 of the retaining arms 48 and the apertures 50 of the voltage regulator module 28. Arranging the pins 29 separate from and independent of the nonmoving member provides for a multitude of different socket arrangements, including implementing the socket-buttressing end with a recess for receiving part or all of the structure supporting the pins 29 and implementing the socket-buttressing end without such a recess in which one edge of the socket buttresses one edge of the structure supporting the pins 29.

Implementing the pins 29 adjacent the end and as part of the nonmoving member, is also advantageous in that the socket 20 can be designed to include the electrical power conductors 78 for connecting the power pins of the CPU (or memory chip) to the power pins of the voltage regulator module. This is illustrated generally in FIG. 3.

Further, a decoupling capacitor circuit including, for example, a number of decoupling capacitors 80 can be included within (or on) the structure of the socket 20. An important advantage provided by arranging both the CPU (or memory chip) and the voltage regulator module closely together on the same socket 20 is that fewer decoupling capacitors 80 are needed.

The foregoing description, which has been disclosed by way of the above examples and discussion, addresses preferred embodiments of the present invention encompassing the principles of the present invention. As discussed above, the embodiments may changed, modified and/or implemented using various structures, circuit types and other arrangements. Those skilled in the art will readily recognize that these and various other modifications may be made to the present invention without strictly following the exemplary embodiments and applications illustrated and described herein. Such changes do not detract from the principles of the present invention, the metes and bounds of which are set forth in the following claims.

What is claimed is:

1. A socket for removably securing an integrated circuit package and a separate electronic item to a printed circuit board, the socket comprising:

a non-moveable member having a first plurality of pin-contacting sections for receiving pins extending from the integrated circuit package, wherein at least one of the pin-contacting sections from the first plurality of pin-contacting sections is to be electrically connected to the printed circuit board; and a moveable member having (1) a second plurality of pin-contacting sections to secure the pins extending from the integrated circuit package when the moveable member is in a locked position, and (2) a retaining projection linked to and moveable with the moveable member, wherein the retaining projection at least partially secures the separate electronic item when the moveable member is moved into the locked position.

2. The socket of claim 1, wherein the retaining projection further comprises a shoulder that fits into an aperture of the separate electronic item when the moveable member is moved into the locked position.

3. The socket of claim 1, wherein the retaining projection is linked to the moveable member to removably secure the separate electronic item on the printed circuit board externally to the socket.

4. The socket of claim 3, wherein the separate electronic item is electrically connected to the printed circuit board by at least one electrical contact that is external to the socket, and the non-moveable member includes a recess for receiving at least part of a first structure that supports the at least one electrical contact.

5. The socket of claim 1 further comprising a first electrical contact to electrically connect the separate electronic item to the printed circuit board.

6. The socket of claim 5 further comprising a first electrical conductor to electrically connect the separate electronic item to the integrated circuit package, wherein the first electrical conductor is not electrically connected to the printed circuit board with respect to a direct current.

7. The socket of claim 6, wherein the separate electronic item is a voltage regulator and the first electrical conductor provides to the integrated circuit package a supply voltage from the voltage regulator.

8. The socket of claim 6 further comprising a decoupling capacitor electrically connected between the first electrical conductor and a common ground of the printed circuit board.

9. A printed circuit board assembly comprising:

a main printed circuit board;

an integrated circuit package;

a separate electronic item; and a socket for removably securing the integrated circuit package and the separate electronic item to the main printed circuit board, the socket including:

(a) a non-moveable member having a first plurality of pin-contacting sections for receiving pins extending from the integrated circuit package, wherein at least one of the pin-contacting sections from the first plurality of pin-contacting sections is electrically connected to the main printed circuit board; and (b) a moveable member having (1) a second plurality of pin-contacting sections to secure the pins extending from the integrated circuit package when the moveable member is in a locked position, and (2) a retaining projection linked to and moveable with the moveable member, wherein the retaining projection at least partially secures the separate electronic item when the moveable member is moved into the locked position.

10. The printed circuit board assembly of claim 9, wherein the retaining projection further comprises a shoulder that fits into an aperture of the separate electronic item when the moveable member is moved into the locked position.

11. The printed circuit board assembly of claim 9, wherein the retaining projection is linked to the moveable member to removably secure the separate electronic item on the main printed circuit board externally to the socket.

12. The printed circuit board assembly of claim 11, wherein the separate electronic item is electrically connected to the printed circuit board by at least one electrical contact that is external to the socket and the non-moveable member includes a recess for receiving at least part of a first structure that supports the at least one electrical contact.

13. The printed circuit board assembly of claim 9, wherein the socket further comprises a first electrical contact to electrically connect the separate electronic item to the printed circuit board.

14. The printed circuit board assembly of claim 13, wherein the socket further comprises a first electrical conductor to electrically connect the separate electronic item to the integrated circuit package, wherein the first electrical conductor is not electrically connected to the printed circuit board with respect to a direct current.

15. The printed circuit board assembly of claim 14, wherein the separate electronic item is a voltage regulator and the first electrical conductor provides to the integrated circuit package a supply voltage from the voltage regulator.

16. The printed circuit board assembly of claim 14, wherein the socket further comprises a decoupling capacitor electrically connected between the first electrical conductor and a common ground of the main printed circuit board.

17. A socket for removably securing an integrated circuit package and a separate electronic item to a printed circuit board, the socket comprising:
   a non-moveable member having a first plurality of pin-contacting sections for receiving pins extending from the integrated circuit package, wherein at least one of the pin-contacting sections from the first plurality of pin-contacting sections is to be electrically connected to the printed circuit board;
   a moveable member having (1) a second plurality of pin-contacting sections to secure the pins extending from the integrated circuit package when the moveable member is in a locked position, and (2) a retaining projection linked to and moveable with the moveable member, wherein the retaining projection at least partially secures the separate electronic item when the moveable member is moved into the locked position; and
   a lever rotatably connected within the non-moveable member, wherein rotation of the lever to a first position causes the moveable member to move into the locked position, thereby securing both the integrated circuit package and the separate electronic item.

18. The socket of claim 17, wherein the retaining projection further comprises a shoulder that fits into an aperture of the separate electronic item when the moveable member is moved into the locked position.

19. The socket of claim 17, wherein the retaining projection is linked to the moveable member to removably secure the separate electronic item on the printed circuit board, externally to the socket.

20. The socket of claim 19, wherein the separate electronic item is electrically connected to the printed circuit board by at least one electrical contact that is external to the socket, and the non-moveable member includes a recess for receiving at least part of a first structure that supports the at least one electrical contact.

21. The socket of claim 17 further comprising a first electrical contact to electrically connect the separate electronic item to the printed circuit board.

22. The socket of claim 21 further comprising a first electrical conductor to electrically connect the separate electronic item to the integrated circuit package, whereby the first electrical conductor is not electrically connected to the printed circuit board with respect to a direct current.

23. The socket of claim 22, wherein the separate electronic item is a voltage regulator and the first electrical conductor provides to the integrated circuit package a supply voltage from the voltage regulator.

24. The socket of claim 23 further comprising a decoupling capacitor electrically connected between the first electrical conductor and a common ground of the printed circuit board.

25. A method for removably securing an integrated circuit package and a separate electronic item into a socket, the method comprising:
   inserting an integrated circuit package into a socket that is in an unlocked position, the socket including a moveable and a non-moveable member, the non-moveable member having a first plurality of pin-contacting sections, the moveable member having a second plurality of pin-contacting sections and a retaining projection;
   inserting a separate electronic item into the socket; and
   moving the moveable member to place the socket into a locked position, wherein the separate electronic item is engaged and at least partially secured by the retaining projection and the integrated circuit package is at least partially secured by the second plurality of pin-contacting sections.

26. The method of claim 25, wherein the act of moving the moveable member to place the socket into a locked position includes the act of rotating a lever in the non-moveable member to laterally move the moveable member into a locked position.

27. A method for removably securing an integrated circuit package and a separate electronic item to a printed circuit board, the method comprising:
   inserting a socket into a printed circuit board, the socket including a moveable and a non-moveable member, the non-moveable member having a first plurality of pin-contacting sections, the moveable member having a second plurality of pin-contacting sections and a retaining projection;
   inserting an integrated circuit package into the socket when it is in an unlocked position;
   connecting a separate electronic item to at least one electrical contact that connects the separate electronic item to a printed circuit board; and
   moving the moveable member to place the socket into a locked position, wherein the separate electronic item is engaged and at least partially secured by the retaining projection and the integrated circuit package is at least partially secured by the second plurality of pin-contacting sections.

28. The method of claim 27, wherein the act of moving the moveable member to place the socket into a locked position includes the act of rotating a lever in the non-moveable member to laterally move the moveable member into a locked position.

* * * * *